(12) United States Patent
Ogiwara

(10) Patent No.: US 7,242,573 B2
(45) Date of Patent: Jul. 10, 2007

(54) ELECTROCONDUCTIVE PASTE COMPOSITION

(75) Inventor: Toshiaki Ogiwara, Tochigi-Ken (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/968,605

(22) Filed: Oct. 19, 2004

(65) Prior Publication Data

US 2006/0082952 A1    Apr. 20, 2006

(51) Int. Cl.
*H01G 9/04* (2006.01)
*H01G 4/008* (2006.01)

(52) U.S. Cl. .................... 361/528; 361/305; 252/500

(58) Field of Classification Search ............... 361/305, 361/306.1, 306.2, 306.3, 308.1, 308.2, 311, 361/509–516, 526–528, 532, 502
See application file for complete search history.

(56) References Cited

U.S. PATENT DOCUMENTS

| | | | |
|---|---|---|---|
| 3,948,811 A | | 4/1976 | Clary et al. |
| 4,051,075 A | | 9/1977 | Smith-Johannsen et al. |
| 5,181,006 A | | 1/1993 | Shafe et al. |
| 5,208,638 A | * | 5/1993 | Bujese et al. ............... 399/310 |
| 6,361,822 B1 | * | 3/2002 | Kurose et al. ................ 427/77 |
| 6,381,121 B1 | * | 4/2002 | Monden et al. ............. 361/525 |
| 2002/0021547 A1 | | 2/2002 | Sakai et al. |
| 2002/0122985 A1 | * | 9/2002 | Sato et al. ................... 429/232 |
| 2003/0087119 A1 | | 5/2003 | Iwabuchi et al. |
| 2003/0095111 A1 | | 5/2003 | Song et al. |
| 2003/0147201 A1 | * | 8/2003 | Kakazawa et al. .......... 361/502 |
| 2004/0131934 A1 | * | 7/2004 | Sugnaux et al. ............ 429/209 |

FOREIGN PATENT DOCUMENTS

| | | |
|---|---|---|
| EP | 1 538 637 A | 6/2005 |
| EP | 1 553 604 A | 7/2005 |
| JP | 06-052721 | 2/1994 |
| JP | 06-215617 | 8/1994 |
| JP | 6-314639 * | 11/1994 |
| JP | 07-014429 | 1/1995 |
| JP | 2002-299833 | 10/2002 |
| JP | 2003-203622 | 7/2003 |
| WO | WO03/106083 * | 12/2003 |
| WO | WO 2004/001772 A | 12/2003 |

OTHER PUBLICATIONS

"Dyneon(tm) fluoroplastic product information", 2000.*

* cited by examiner

*Primary Examiner*—Eric W. Thomas

(57) ABSTRACT

An electroconductive paste composition characterized in that an electroconductive powder with a mean grain size of 1 μm or less and a copolymer binder composed of tetrafluoroethylene, hexafluoropropylene, and vinylidene fluoride are dispersed in a solvent. The present invention provides an electroconductive paste. composition that can be cured at low temperatures and can be endowed with low resistivity as a result of using a conventional mixing technique without the need for particularly expensive materials or techniques.

4 Claims, No Drawings

ELECTROCONDUCTIVE PASTE COMPOSITION

TECHNICAL FIELD

The present invention relates to an electroconductive paste composition. More particularly, the present invention relates to an electroconductive paste composition that can be cured at low temperatures of 200° C. or less and formed into an electroconductive coating film having a resistivity of less than $10^{-5}$ Ω·cm. The composition can be used for substrates that have low heat resistance, such as plastics or the like, and can be used to form thin electroconductive wirings because of the low resistivity of the resulting coating film.

BACKGROUND TECHNOLOGY

Conventionally, electroconductive compositions that can be dried and cured at 200° C. or less are often obtained, for example, as a result of mixing an electroconductive powder with thermoplastic resins such as polyester resins and acrylic resins, or with thermosetting resins such as epoxy resins and urethane resins, and then mixing the product with a suitable solvent.

However, with paste compositions obtained as a result of mixing an electroconductive powder with the usual thermoplastic resins or thermosetting resins, the resistivity of a film obtained by means of drying and curing the compositions is not sufficiently low, and is usually $10^{-5}$ Ω·cm or greater. The increase in film resistivity poses a problem, particularly during the formation of thin electroconductive wirings from those paste compositions. Further, films obtained by means of drying and curing such pastes are known to have poor solderability. In order to improve solderability, use of specific electroconductive powders, such as silver coated powders, silver-copper alloy powders, and graded material powders has been suggested (see Patent Documents 1 to 3)

To obtain a film of lower resistivity, baking-type electroconductive paste compositions are commonly used. Baking-type electroconductive paste compositions are compositions commonly containing electroconductive powders, glass frit, and dispersants. The baking-type electroconductive paste compositions yield films having a resistivity of about $10^{-6}$ Ω·cm, but they require that baking be conducted at temperatures of at least 500° C. or greater to achieve this level of resistivity.

In recent years, the use of finer electroconductive powders (all the way to the nanosize) made it possible to perform baking at a temperature of about 200° C., and baking-type electro-conductive paste compositions capable of forming coating films with a resistivity of about $10^{-6}$ Ωcm have been proposed (see Patent Document 4). It has also been proposed to use electroconductive paste compositions that are obtained as a result of mixing finer silver oxide powders (all the way to the nanosize) and tertiary fatty acid silver salts, and that are capable of forming low-resistance films at low temperatures (see Patent Document 5).

| Document 1 | JP (Kokai) 07-014429 |
| Document 2 | JP (Kokai) 06-215617 |
| Document 3 | JP (Kokai) 06-052721 |
| Document 4 | JP (Kokai) 2002-299833 |
| Document 5 | JP (Kokai) 2003-203622 |

DISCLOSURE OF THE INVENTION

The high baking temperatures of the baking-type electroconductive paste compositions have a limitation in that they are not applicable to substrates with low heat resistance. On the other hand, all the methods in which nanosized electroconductive powders are used (Patent Documents 4 and 5) are expensive compared with methods in which electroconductive paste compositions are obtained as a result of mixing the usual electroconductive powders and organic resin binders, and cannot as yet be regarded as having have high practical value.

Therefore, there exists a demand for electroconductive paste compositions that could be cured at low temperatures and yield lower resistivity as a result of employing a conventional mixing technique without the need for particularly expensive materials or techniques.

Aimed at addressing the problem mentioned above, the electroconductive paste composition of the present invention is characterized in that an electroconductive powder with a mean grain size of 1 μm or less and a copolymer binder composed of tetrafluoroethylene, hexafluoropropylene, and vinylidene fluoride are dispersed in a solvent. The present invention also provides an electroconductive coating film formed as a result of drying the composition at a temperature of 200° C. or less.

The electroconductive paste composition of the present invention can be cured at a temperature of 200° C. or less to form an electroconductive coating film with a resistivity of $10^{-5}$ Ω·cm and a high degree of fineness. The electroconductive coating film thus obtained has excellent soldering properties. Further, the electroconductive paste composition of the present invention can be prepared without using expensive materials or special technology, and thus has high practical value.

The electroconductive paste composition of the present invention can be screen-printed and is particularly suited for forming wirings or the like on printed boards that include flexible boards.

The electroconductive paste composition of the present invention is formed by means of a method in which an electroconductive powder with a mean grain size of 1 μm or less and a copolymer binder composed of tetrafluoroethylene, hexafluoropropylene, and vinylidene fluoride are dispersed in a solvent.

The electroconductive powder may be a silver powder, a pulverulent electroconductive/insulating material coated with silver, a pulverulent silver alloy, or the like. The mean grain size of the electroconductive paste composition according to the present invention is 1 μm or less, preferably 0.01 μm to 1 μm, and ideally 0.1 to 1 μm. At least 80 mass % of the electroconductive powder preferably has a grain size of 1 μm or less, more preferably 0.01 μm to 1 μm, and ideally 0.1 to 1 μm. The electroconductive powder may have a spherical shape, spheroid shape, or polyhedral shape.

The binder that can be employed in the present invention is a copolymer formed as a result of the copolymerization of tetrafluoroethylene (TFP), hexafluoropropylene (HFP), and vinylidene fluoride (VdF). The copolymer employed in the present invention should preferably have a melting point of less than 200° C., preferably 100 to 195° C., and more preferably 110 to 150° C. (ASTM D4591). The copolymer should preferably have a melt flow index of 10 g/10 min or more, preferably 15 g/10 min or more, and more preferably 20 g/10 min or more (ASTM D1238, 265° C., weight: 5 kg). Having such a range of melting points and melt flow indices is advantageous for dissolving the binder in the organic solvent. Further, the binder should preferably have a solubility of 10 mass % or more (solid fraction), and more preferably 20 mass % or more (solid fraction), in the organic solvents described below.

Specific examples of organic solvents employed in the present invention include ketone solvents such as cyclohexanone, derivatives thereof, acetone, methyl ethyl ketone, methyl isopropyl ketone, and the like; ester solvents such as ethyl acetate, isopropyl acetate, and the like; and ether solvents such as tetrahydrofuran, dimethoxyethane, diethylene glycol dimethyl ether, and the like. The solvent to be used in the present invention can be selected by taking into consideration the solubility of the binder, the viscosity of the resulting paste composition, the boiling point (a solvent with reduced evaporation during conditions and increased evaporation during drying is preferred), and the like. The preferred solvent for the present invention is trimethyl cyclohexanone (boiling point: 189° C.).

The electroconductive paste composition of the present invention is prepared as a result of dispersing the electroconductive powder and binder in the solvent. It is possible to first prepare the binder solution by means of dissolving the binder in the solvent, and then dispersing the electroconductive powder in the binder solution. The dispersion can be carried out using conventional dispersion equipment such as a roll mill (for example, a three-roll mill or the like), ball mill, or the like. In the resulting electroconductive paste composition, the electroconductive powder/binder ratio is preferably 90:10 or more, more preferably 92:8 or more, and ideally 94:6 or more, based on weight. As a result of keeping the ratio in this range, the resistivity of the coating film obtained by means of drying of the electroconductive paste composition can be kept at the desired level. It is further preferred that the electroconductive paste composition have a viscosity of 50 to 500 Pa·s or less, and preferably 100 to 300 Pa·s, at 25° C. (JIS K5400). As a result of maintaining the viscosity in this range, it is possible to make it easier to screen-print the electroconductive paste composition and to form fine patterns.

An electroconductive coating film can be obtained as a result of bonding the electro-conductive paste composition thus obtained to a substrate and drying the composition at a temperature of 200° C. or less, and preferably at 150 to 200° C. The electroconductive paste can be applied by means of conventional technique preferably screen printing. The substrate to which the electroconductive paste is bonded may be a high-resistance substrate with high heat resistance such as glass, semiconductor (silicon), or the like, or a plastic substrate with low heat resistance (a common printed plate, flexible printed plate, or the like). The deposited paste composition can be dried for a time that ensures complete evaporation of the solvent, usually within 2 hours.

The resulting electroconductive coating film has a resistivity of less than $10^{-5}$ Ωcm, preferably $2.5$–$9.0 \times 10^{-6}$ Ωcm, and more preferably in the range of $5.0$–$8.5 \times 10^{-6}$ Ωcm.

The electroconductive coating film can be easily soldered with conventional solders, and the film surface does not repel the solder.

The electroconductive coating film of the present invention can also form fine patterns. For example, it is possible to form wiring patterns with a line width of 200 μm or less and a line interval of 200 μm or less. It is also possible to form exceptionally fine wiring patterns with a line width of 100 μm or less and a line interval of 100 μm or less.

Applications The present invention is useful in many electronic applications, such as multilayer ceramic capacitors, tantalum capacitors, touch panel displays, and inductors.

The composition of the present invention is particularly useful as the conductive layer (typically a functional polymeric silver layer) of a capacitor. Typically, the capacitor is a tantalum capacitor. However, the composition(s) of the present invention may be utilized in other types of capacitors including, niobium and niobium oxide capacitors, as well.

Various methods can be utilized to apply the conductive layer onto the conductive carbon/graphite layer to form the capacitor. For example, conventional techniques such as sputtering, screen-printing, dipping, electrophoretic coating, electron beam deposition, spraying, ink jet printing and vacuum deposition, can be used to form the conductive layer.

WORKING EXAMPLE 1

Thermoplastic fluororesin Dyneon THV220 (registered trade name of a TFE/HFP/VdF copolymer manufactured by Sumitomo 3M) was first dissolved in trimethyl cyclohexanone (manufactured by Degussa Co.), and a resin solution containing 20 mass % of the resin with respect to the total weight of the solution was prepared.

Next, a mixture of 9.3 parts by mass of this resin solution, 90.7 parts by mass of spherical silver powder with a mean grain size of 0.7 μm, and 3 parts by mass of trimethyl cyclohexanone was kneaded in a three-roll mill, and an electroconductive paste composition having a viscosity of 191 Pa·s at 25° C. was prepared. The powder/resin ratio of this electroconductive paste composition was 98:2, based on weight.

With the resulting electroconductive paste composition, wiring patterns of varying degrees of fineness were screen printed on the glass substrate and dried for 1 hour at 200° C. The resistivity of the resulting electroconductive coating films was $5.4 \times 10^{-6}$ Ω·cm. When the drying conditions were changed to 160° C. and 1 hour, the resistivity of the resulting electroconductive coating film was $6.8 \times 10^{-6}$ Ω·cm.

When any of drying conditions were used, it was possible to form wiring patterns with a line width of 100 μm and a line interval of 100 μm without the occurrence of broken lines or short-circuiting of adjacent lines. Moreover, when solder was deposited on the resulting electroconductive coating film by means of using an electric soldering iron heated to 350° C., the solder wetted the entire surface of the electroconductive coating film and was not repelled by the film.

WORKING EXAMPLE 2

Except for changing the mixing ratio to 20.8 parts by mass of resin solution and 79.2 parts by mass of spherical silver powder, the procedure described in Working Example 1 was repeated. The silver powder/resin ratio of the electroconductive paste composition was 95:5, based on weight. The resulting electroconductive paste composition had a viscosity of 130 Pa·s at 25° C.

When drying conditions corresponding to 200° C. and 1 hour were established, the resistivity of the resulting electroconductive coating film was $5.4 \times 10^{-6}$ Ωcm. When drying conditions corresponding to 160° C. and 1 hour were established, the resistivity was $7.4 \times 10^{-6}$ Ω·cm.

Under both types of drying conditions, it was possible to form wiring patterns with a line width of 100 μm and a line interval of 100 μm without the occurrence of broken lines or short-circuiting of adjacent lines. Moreover, when solder was deposited on the resulting electro-conductive coating film by means of using an electric soldering iron heated to 350° C., the solder wetted the entire surface of the electro-conductive coating film and was not repelled by the film.

WORKING EXAMPLE 3

Except for changing the mixing ratio to 24.2 parts by mass of resin solution, 75.8 parts by mass of spherical silver powder, and 1 part by mass of trimethylcyclohexane, the procedure described in Working Example 1 was repeated. The silver powder/resin ratio of the electro-conductive paste composition was 94.0:6.0, based on weight.

When drying conditions corresponding to 200° C. and 1 hour were established, the resistivity of the resulting electroconductive coating film was $6.3 \times 10^{-6}$ Ω·cm. When drying conditions corresponding to 160° C. and 1 hour were established, the resistivity was $8.2 \times 10^{-6}$ Ω·cm.

Under both drying conditions, it was possible to form wiring patterns with a line width of 100 μm and a line interval of 100 μm without the occurrence of broken lines or short-circuiting of adjacent lines. Moreover, when solder was deposited on the resulting electroconductive coating film by means of using an electric soldering iron heated to 350° C., the solder wetted the entire surface of the electro-conductive coating film and was not repelled by the film.

COMPARATIVE EXAMPLE 1

An acrylic resin solution in which resin accounted for 17 mass % of the total weight of the solution was prepared as a result of dissolving the acrylic resin Elvacite 2041 (registered trade name of a product manufactured by Lucite Co.) in DBE (registered trade name of a product manufactured by Invista Co.).

Next, a mixture of 10.7 parts by mass of this acrylic resin solution and 89.3 parts by mass of the spherical silver powder with the mean grain size 0.7 μm employed in Working Example 1 was kneaded in a three-roll mill, and an electroconductive paste composition having a viscosity of 240 Pa·s at 25° C. was prepared. Similar to Working Example 1, the silver powder/resin ratio of this electroconductive paste composition was 98:2, based on weight.

With the resulting electroconductive paste composition, wiring patterns of varying degrees of fineness were screen printed on glass substrate and dried for 1 hour at 160° C. The resistivity of the resulting electroconductive coating films was $2.1 \times 10^{-6}$ Ω·cm.

Using the electroconductive paste composition of this Comparative Example, it was possible to form wiring patterns with a line width of 100 μm and a line interval of 100 μm without the occurrence of broken lines or short-circuiting of adjacent lines, but when solder was deposited on the resulting electroconductive coating film by means of using an electric soldering iron heated to 350° C., the solder was repelled by the film.

COMPARATIVE EXAMPLE 2

A polyester resin solution in which resin accounted for 30 mass % of the total weight of the solution was prepared as a result of dissolving the polyester resin Elitel UES220 (registered trade name of a product manufactured by Unitika Co.) in Dowanol PPH (registered trade name of a product manufactured by Dow Chemical Co.)

Next, a mixture of 6.4 parts by mass of this polyester resin solution, 93.6 parts by mass of the spherical silver powder with the mean grain size 0.7 μm employed in Working Example 1, and 6 parts by mass of Dowanol PPH (registered trade name) was kneaded in a three-roll mill, and an electroconductive paste composition having a viscosity of 200 Pa·s at 25° C. was prepared. Similar to Working Example 1, the silver powder/resin ratio of this electroconductive paste composition was 98:2, based on weight.

Using the resulting electroconductive paste composition, wiring patterns of varying degrees of fineness were screen printed on glass substrate and dried for 1 hour at 160° C. The resistivity of the resulting electroconductive coating films was $7.7 \times 10^{-6}$ Ωcm.

Using the electroconductive paste composition of this Comparative Example, it was possible to form wiring patterns with a line width of 100 μm and a line interval of 100 μm without the occurrence of broken lines or short-circuiting of adjacent lines, but when solder was deposited on the resulting electroconductive coating film by means of using an electric soldering iron heated to 350° C., the solder was repelled by the film.

As is evident from the results shown in the Table on the following page, the electroconductive paste composition of the present invention can form an electroconductive coating film with a low resistivity of less than $10^{-5}$ Ω·cm even when cured at low temperatures of 200° C. or less. A fine electroconductive coating film can be formed using the electroconductive paste composition of the present invention, which is effective for increasing the degree of integration of parts on printed plates. Combined with the low resistivity of the resulting coating film, the paste is effective for forming circuit elements of low resistivity and reduced power consumption. The resulting electroconductive coating film can be readily soldered, and can thus simplify external connections of circuit elements.

TABLE

Results of working examples and comparative examples are summarized

|  | Working Example 1 | Working Example 2 | Working Example 3 | Comparative Example 2 | Comparative Example 1 |
|---|---|---|---|---|---|
| Silver powder |  | 90.7 | 82.8 | 76.8 | 89.3 | 93.6 |
| THV220 (20% solution) |  | 9.3 | 17.2 | 24.2 |  |  |
| Elvacite 2041 (17% solution) |  |  |  |  | 10.7 |  |
| UE 3220 (30% solution) |  |  |  |  |  | 6.4 |
| Silver powder/Resin |  | 98:2 | 96:4 | 94:6 | 98:2 | 98:2 |
| Resistivity $\times 10^{-6}$ Ω·cm | 200° C., 1 hr | 6.6 | 5.7 | 5.3 |  |  |

TABLE-continued

Results of working examples and comparative examples are summarized

| | | Working Example 1 | Working Example 2 | Working Example 3 | Comparative Example 2 | Comparative Example 1 |
|---|---|---|---|---|---|---|
| Resisitivity ×$10^{-6}$ Ω · cm | 160° C., 1 hr | 7.5 | 7.6 | 8.2 | 21 | 77 |
| Viscosity*[1] | | ○ | ○ | ○ | ○ | ○ |
| Ease of solder deposition*[2] | | ○ | ○ | ○ | X | X |

*[1]For wirings with a width of 100 μm and an interval of 100 μm, "○" designates that there were no defects, and "X" designates that defects were present.
*[2]For soldering with an electric iron at 350° C., "○" designates that solder was not repelled, and "X" designates that solder was repelled

What is claimed is:

1. An electroconductive paste composition comprising
an electroconductive powder comprising
a silver powder, a purverlent electroconductive/insulating material coated with
silver or a purverlent silver alloy
with a mean grain size of less than 1 μm and
a copolymer binder composed of tetrafluoroethylene, hexafluoropropylene, and vinylidene fluoride dispersed in a solvent,
wherein the weight ratio in the composition of the electroconductive powder to the binder is in the range between about 90–10 to about 94–6, which composition exhibits a resistivity in the range between about $2.5 \times 10^{-6}$ ohm cm to about $9.0 \times 10^{-6}$ ohm cm upon drying at a temperature of 200° C. or less.

2. The electroconductive composition of claim 1 in the form of an electroconductive coating film formed as a result of drying the composition at a temperature of 200° C. or less.

3. The electroconductive coating film of claim 2 in the form of a patterned layer applied to a substrate.

4. The electroconductive composition of claim 2 in a capacitor in the form of an electroconductive coating film.

* * * * *